(12) United States Patent
Wirth (10) Patent No.: US 7,955,123 B2
(45) Date of Patent: Jun. 7, 2011

(54) CELL CONNECTOR FOR ELECTRONICALLY CONTACTING PLANAR POWER SOURCES, AND USE THEREOF

(75) Inventor: Harry Wirth, Merzhausen (DE)

(73) Assignee: Fraunhofer-Gesellschaft Zur Förderung Der Angewandten Forshung E.V., München (DE)

( * ) Notice: Subject to any disclaimer, the term of this patent is extended or adjusted under 35 U.S.C. 154(b) by 0 days.

(21) Appl. No.: 12/441,840

(22) PCT Filed: Oct. 19, 2007

(86) PCT No.: PCT/EP2007/009101
§ 371 (c)(1),
(2), (4) Date: May 11, 2009

(87) PCT Pub. No.: WO2008/046648
PCT Pub. Date: Apr. 24, 2008

(65) Prior Publication Data
US 2009/0318037 A1    Dec. 24, 2009

(30) Foreign Application Priority Data

Oct. 20, 2006  (DE) .......................... 10 2006 049 603

(51) Int. Cl.
*H01R 3/00* (2006.01)
(52) U.S. Cl. ......... 439/500; 439/883; 439/627; 136/256
(58) Field of Classification Search .................. 439/500, 439/627, 875, 883; 136/244, 245, 256
See application file for complete search history.

(56) References Cited

U.S. PATENT DOCUMENTS

| | | | |
|---|---|---|---|
| 3,466,198 | A | 9/1969 | Yasui |
| 5,430,616 | A | 7/1995 | Katsu et al. |
| 6,313,395 | B1 | 11/2001 | Crane et al. |
| 6,359,209 | B1 | 3/2002 | Glenn et al. |
| 7,390,961 | B2 | 6/2008 | Aschenbrenner et al. |
| 2003/0047206 | A1 | 3/2003 | Kawam |
| 2004/0094195 | A1 | 5/2004 | Kuechler |
| 2005/0022857 | A1 | 2/2005 | Daroczi et al. |
| 2005/0268959 | A1 | 12/2005 | Aschenbrenner et al. |
| 2006/0162764 | A1 | 7/2006 | Toyama |
| 2007/0017570 | A1 | 1/2007 | Endo et al. |
| 2008/0053511 | A1 | 3/2008 | Nakamura |

FOREIGN PATENT DOCUMENTS

| | | |
|---|---|---|
| DE | 4330282 A1 | 3/1994 |
| DE | 19848682 A1 | 5/2000 |
| DE | 10235048 A1 | 2/2004 |

(Continued)

OTHER PUBLICATIONS

International Preliminary Report and Written Opinion for corresponding patent application PCT/EP2007/009101, May 14, 2009.

(Continued)

*Primary Examiner* — Khiem Nguyen
(74) *Attorney, Agent, or Firm* — Timothy X. Gibson; Gibson & Dernier LLP (57) ABSTRACT

A cell connector (CC) for electrical contacting of planar current sources, the cell connector being able to be contacted electrically with the current source merely in regions. The cell connector thereby includes at least one electrically conductive layer which is configured as a transit region and via contact regions which constitute merely a fraction with respect to the total surface area of the transit region is contacted with the current source.

34 Claims, 5 Drawing Sheets

FOREIGN PATENT DOCUMENTS

| | | |
|---|---|---|
| DE | 102005038250 A1 | 3/2006 |
| EP | 1684361 A2 | 7/2006 |
| JP | 62016579 A | 1/1987 |
| JP | 11312820 A | 11/1999 |
| JP | 2005252062 A | 9/2005 |
| JP | 2006049666 A | 2/2006 |
| JP | 2006073706 A | 3/2006 |
| WO | 2005013322 A2 | 2/2005 |
| WO | 2005106970 A1 | 11/2005 |
| WO | 2005122282 A2 | 12/2005 |

OTHER PUBLICATIONS

International Search Report and Written Opinion for corresponding patent application PCT/EP2007/009101, Sep. 4, 2008.
German Office Action for DE102006049603.5-33, May 29, 2007.

Fig. 1 (State of the Art)

CELL CONNECTOR FOR ELECTRONICALLY CONTACTING PLANAR POWER SOURCES, AND USE THEREOF

FIELD OF THE INVENTION

The present invention relates to a cell connector (CC) for electrical contacting of planar current sources, the cell connector being able to be contacted electrically with the current source merely in regions. A configuration of this type of this connector ensures that as little as possible mechanical stress occurs, for example during heating of the entire device.

BACKGROUND

For incorporation in modules, solar cells on a wafer basis are connected electrically in groups. The cell current must be guided from the cell surface to the cell edge and from there further to an adjacent cell. In most cases, the collection of partial currents from the cell surface and the transfer to the adjacent cell is effected by metallic cell connectors (CC). For contacting the CC, take-off points are provided in the cell surface or at the cell edge.

The conductive cross-section of the CC must be adequate for conducting through currents of several amperes (5-30) per cell with low losses. On the other hand, the CC should only introduce limited mechanical stresses into the contact points. Such mechanical stresses occur between adjacent contact points on individual cells and also on both sides of a bridged cell intermediate space. The mechanical stresses are caused by thermal expansion differences during production and operation of the modules and also deformation of the modules.

In the case of solar cells with contacts on both sides (BSCC), casting the front-side in shadow by the CC must be minimised in addition, this requirement not applying in the case of rear-side contact cells (RSCC).

In the case of BSCC, the cell-side take-off points are disposed on the front-side along straight lines and connected to continuous strips (busbars). On the rear-side a planar metallisation is normal. In the case of RSCC, the take-off points of both polarities are disposed on the rear-side either at the cell edge or in the cell surface. If they are situated at the cell edge, then the CC has no current-collecting function.

Figure 1:
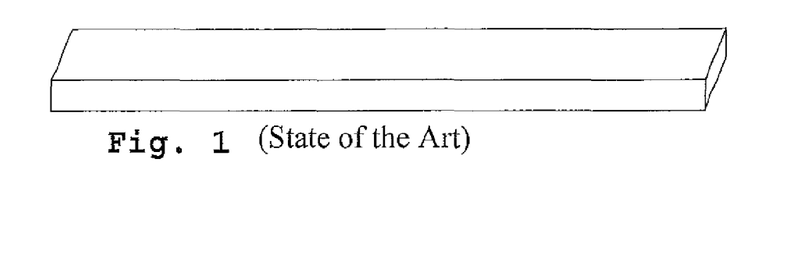
FIG. 1 a cell connector for connecting solar cells, as is known from the state of the art, FIG. 2 a single-layer, textured cell connector for connecting solar cells, FIG. 3 a single-layer, textured cell connector for connecting solar cells, two transit regions respectively being disposed adjacent to the contact regions due to the texturing, FIG. 4 an arrangement of solar cells which are connected via a cell connector which has a varying cross-section in the current direction, FIG. 5 a textured cell connector for connecting solar cells, which has a varying cross-section in the current direction, FIG. 6 a cell connector according to the invention for connecting solar cells, which has a two-layer structure (applied on a solar cell in FIG. 6A and represented in perspective in FIG. 6B), FIG. 7 a connection option of two solar cells via a cell connector according to the invention which has a shoulder, FIG. 8 a cell connector with a planar configuration for connecting solar cells, having take-off points in the edge region, the cell connector being textured in the region between the solar cells, FIG. 9 a means analogous to FIG. 8 in rectangular embodiment, the cell connector being textured in the region between the solar cells or above the cells, FIG. 10 a cell connector with a planar configuration for connecting solar cells, having take-off points in the edge region, the contact regions being mounted in pairs over a textured region on a connection piece which carries a plurality of contact pairs. The current flows perpendicularly to the connection piece.

In the module production, planar cell connectors (CC) made of coated copper are used. In the case of BSCC, the cross-section thereof is constant and typically is approx. 2 mm×0.15 mm (FIG. 1). They are soldered respectively onto the front side over the entire length on the busbar of a cell and alternate via an offset portion backwards, to the rear-side of the neighbouring cell.

For RSCC with edge contacts, closed, curved or lozenge-shaped CC portions are used for bridging the cell intermediate space, said portions being connected to each other optionally (WO 2005 013 322, WO 2005 122 282).

In DE 43 30 282, U.S. Pat. No. 6,313,395 and JP 62 016 579, a stress-reducing portion in the CC is proposed at the transition between the cells. This embodiment produces high mechanical stress peaks in the CC without significantly lowering the stresses at the take-off points of the cell.

JP 11 312 820 describes a CC with a portion for reducing mechanical stresses in the region of the cells. These portions are configured as raised portions. Their effectiveness is limited because the encapsulation material penetrates underneath during the lamination process and this material subsequently hardens.

SUMMARY OF THE INVENTION

Starting from the state of the art, it is hence the object of the present invention to indicate a means for electrical connection of at least two current sources which, in comparison with the state of the art, ensures better reduction in mechanical stress at the take-off points of the current sources, without however having negative influences on the current conductivity.

According to the invention, a cell connector in a planar form for electrical contacting of at least two planar current sources is provided, which cell connector comprises at least one first electrically conductive layer which has at least one contact region for making contact in regions with each of the current sources, the non-contactable region forming a transit region for current conduction, wherein a) the cross-section (B) of the cell connector in the at least one contact region is smaller in the main current direction than the maximum cross-section (A) of the cell connector in the main current direction and/or
b) that at least the first conductive layer outwith the at least one contact region comprises at least one region, the course of which is not linear in the main current direction and which is subdivided by at least one oblong stamped-out division or opening into at least two strips which extend essentially parallel to the main current direction.

Figure 2:
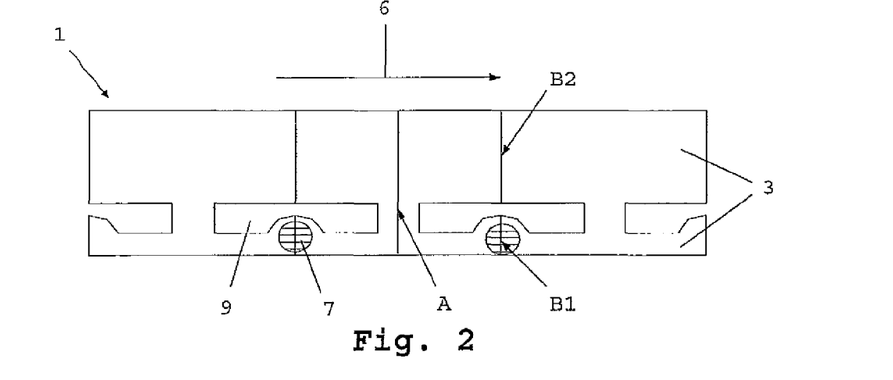

According to the invention, there is understood by a contact region the region at which the cell connector is connected to the current source. This can be effected for example by soldering, gluing or other connections which enable a current-conducting connection of the cell connector to the current source. With reference to FIG. 2 there is understood by the cross-section of the cell connector the surface area which is produced by the section along the lines A or B1 and B2. This sectional surface area hence also depends upon the thickness (i.e. the dimensioning in the drawing plane of FIG. 2).

It is hence essential to the invention that the cell connector is connected merely at points to the current source.

Figure 7:
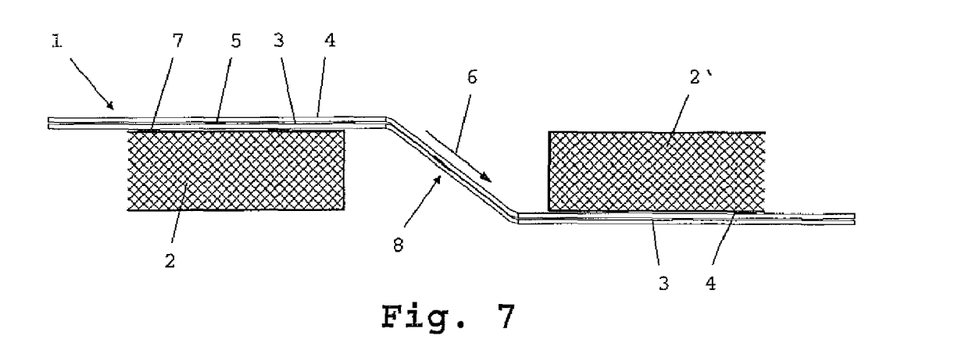
Figure 8:
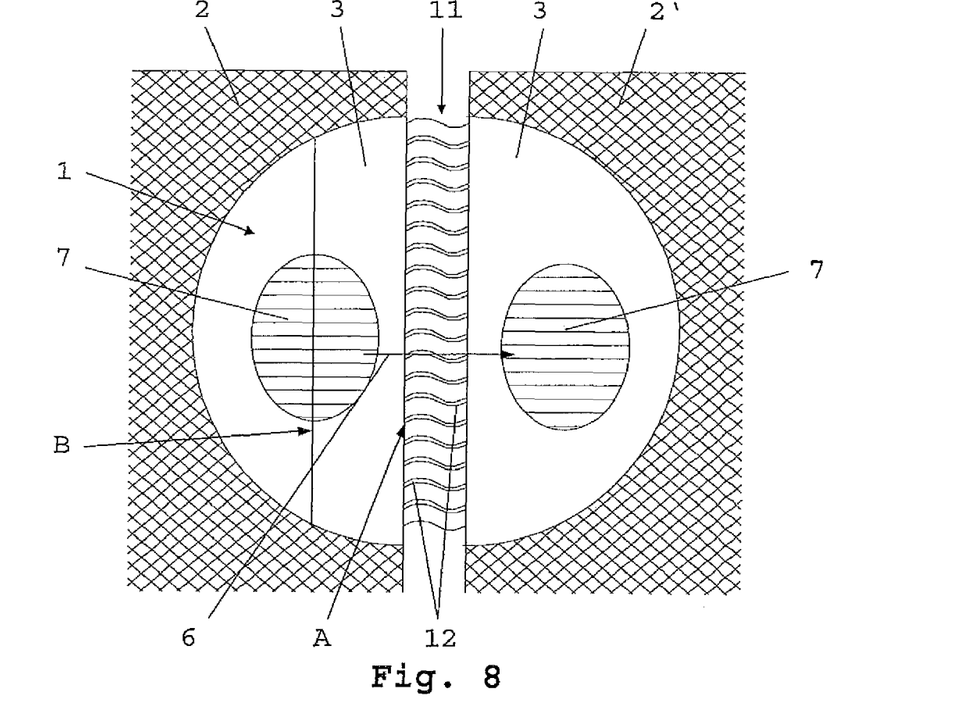
Figure 9:
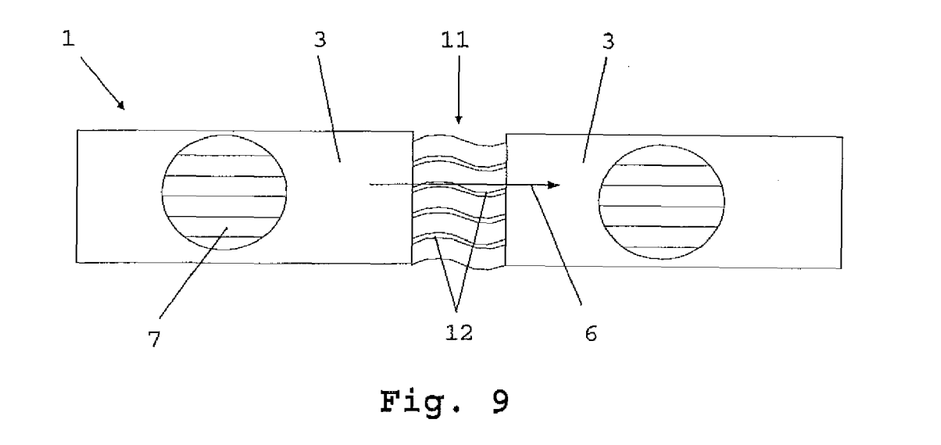
Figure 10:
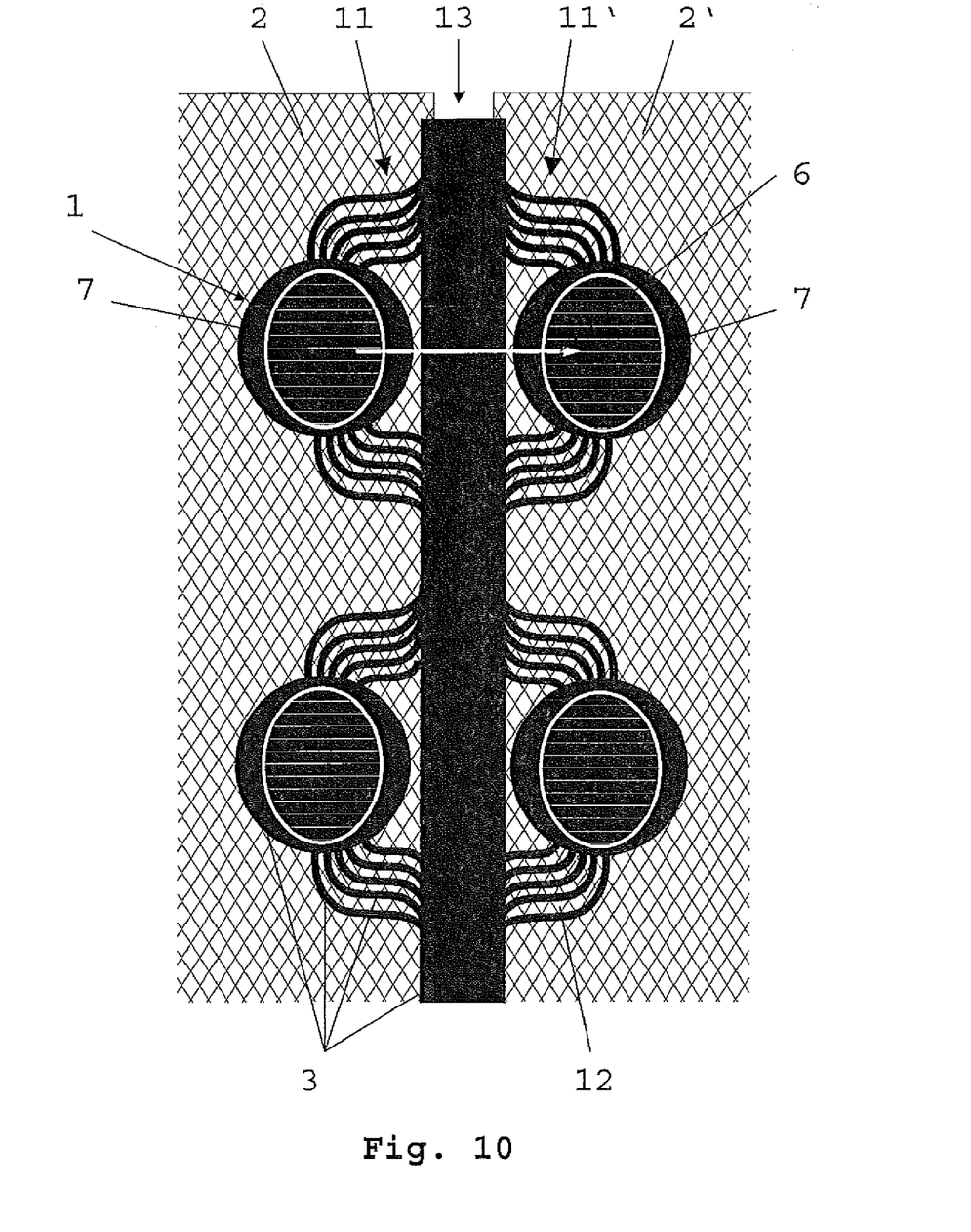

The connection between two contact points of the CC is weakened according to the invention with respect to the modulus of elasticity by cross-sectional thinning (FIG. 2, 3, 4, 5, 6, 7) or
by cross-sectional segmentation (FIG. 8, 9, 10).

Such an embodiment of a means for electrical connection of current sources, relative to the state of the art, offers the following advantages:

current sources, for example solar cells, CC and contact points are stressed less by mechanical stresses.

module producers can manufacture thinner current sources and make connections with higher-melting, lead-free soldering, hence saving costs and protecting the environment or fulfilling corresponding conditions.

by configuring the CC with a variable cross-section, also conductive material can be saved.

The maximum cross-section (A) is thereby advantageously dimensioned such that the total current flowing between the current sources with a maximum electrical load can flow without a heat load which damages the cell connector. Hence the cross-section depends directly upon the type or the dimensioning of the current sources which are used. In the case where the current source is a solar cell, the dimensioning of the cross-section hence depends for example upon the useful surface area or the power of the solar cell. For smaller solar cells, a small cross-section in fact suffices here, whilst a correspondingly large cross-section must be chosen in the case of more powerful solar cells.

Furthermore, it is advantageous if the cross-section of the at least one region is dimensioned such that the total current flowing between the current sources with a maximum electrical load can flow without a heat load which damages the cell connector.

In a first preferred embodiment, at least the first layer thereby has at least one opening for texturing, which abuts against the respective contact region. This leads to a further increase in flexibility of the cell connector. The texturing can thereby be effected via the normal methods known from the state of the art, for example etching, punching or milling. The cell connector hence retains high flexibility relative to the current source so that, for example with mechanical expansion (in particular if the current source and the material of the cell connector have different coefficients of heat expansion), a reduction in the otherwise occurring mechanical stress is ensured. The openings are thereby not restricted to a particular geometrical shape, but preferably they have however an essentially square, rectangular, lozenge-shaped oval and/or circular configuration. The total surface area of the at least one opening relative to the total surface area of the first layer thereby has preferably a ratio of 0.1 to 0.75, preferably 0.1 to 0.5, particularly preferred between 0.2 and 0.4.

Furthermore, it is preferred if the number of openings corresponds to the number of contact regions 7, i.e. that an opening 9 is assigned to each contact region 7, the contact region and the respective openings being in the immediate vicinity of each other. An embodiment of this type is shown for example in FIG. 2 where an opening is disposed on respectively one side of each contact region.

As an alternative hereto, it is likewise favourable if at least two openings are assigned to each contact region, in particular two openings which are disposed respectively on an oppositely-situated side of the contact region. An embodiment of this type is reproduced in FIG. 3 where each contact region is flanked or surrounded on both oppositely-situated sides by respectively one opening 9.

Figure 4:
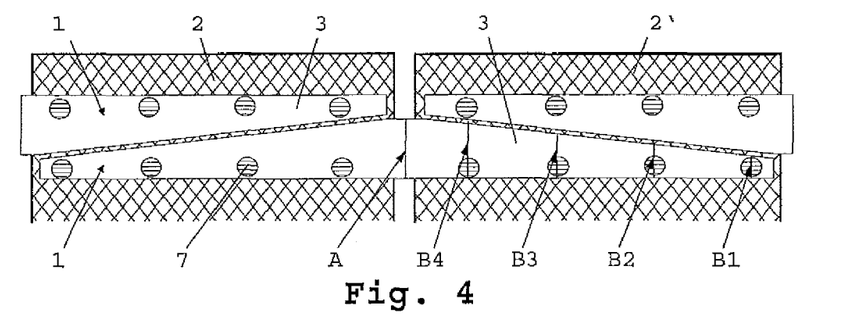

A further preferred alternative or additional embodiment provides that the cell connector has an increasing and/or reducing cross-section in the current direction. Embodiments of this type are reproduced for example in FIGS. 4 and 5. In the embodiment as represented in FIG. 4, the cross-section of the cell connector in the region of the contact regions 7 increases constantly starting from the edge region towards the centre (B1 to B4) and reaches its maximum (cross-section A) in the centre between the current sources to be connected. Of course this advantageous embodiment, according to which the cross-section varies, can also be combined with the previously discussed embodiments, according to which at least the first surface area of the cell connector 3 has texturing. An embodiment of this type is represented for example in FIG. 5.

Figure 6A:
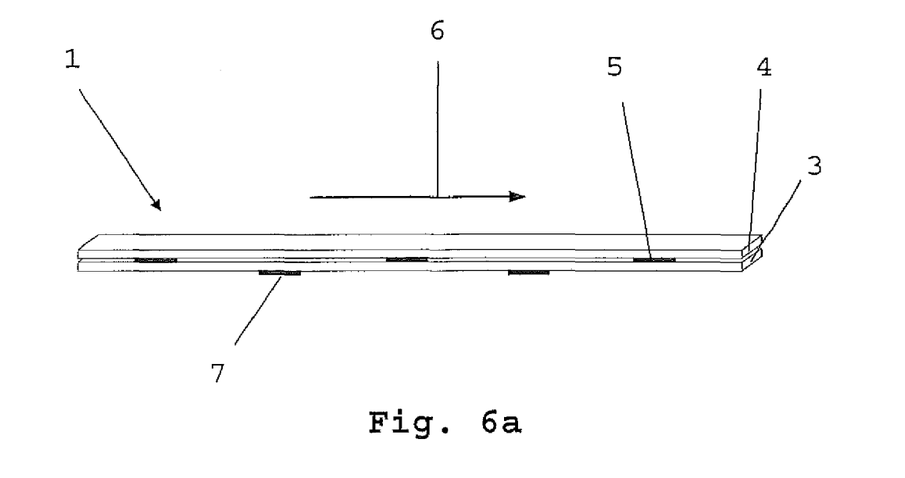
Figure 6B:
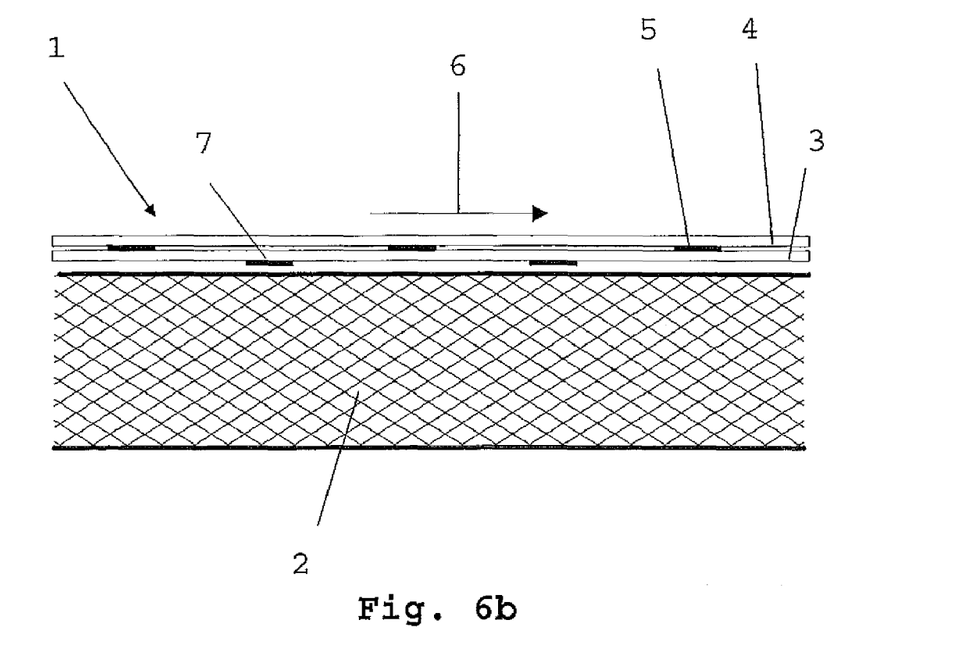

As a further preferred embodiment of the cell connector, the latter can be configured in such a manner that a second layer which conducts current is disposed on the side of the first layer which is orientated away from the current source, said second layer having a contact for making contact in regions with the first layer. Hence a further increase in current throughput and mechanical strength can be effected whilst avoiding mechanical stresses. The contacting of both layers can thereby be effected via soldered contacts. Analogously, further layers can likewise be applied on the second layer and/or on each further layer. It is thereby favourable if the contact regions of the first layer for the current source and the contact regions between first and second layer—as represented in FIGS. 6a, 6b and 7—are offset relative to each other.

Figure 5:
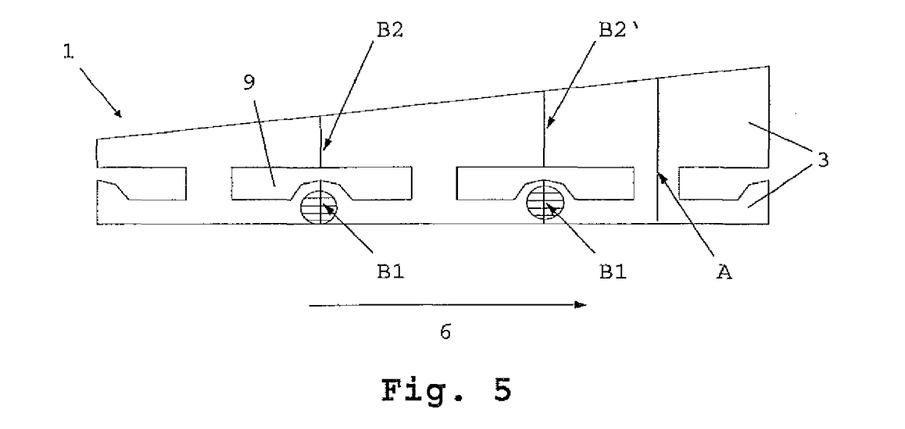

The maximum conducting cross-section (A) is defined here such that it represents the sum of the layer thicknesses of the first layer 3, the second layer 4 including the contact 5 disposed between the layers. In the region of the contacting of the first layer with the current source in which no contacting between the two layers 3 and 4 is present, the entire cell connector 1 hence has a smaller cross-section since here no contact 5 is applied in fact between the layers 3 and 4. Of course both the layer 3 and the layer 4 and also any further layer can have the texturings represented in FIGS. 2 and 3, these structurings being configured then in such a manner that for example the layer 3 is perforated in the direction of the layer 4; on the other hand, it is conceivable here also that the layers 3 and/or 4 have a corresponding varying cross-section (as represented in FIG. 4). Of course also combinations of the previously mentioned possibilities are indicated, as represented in FIG. 5.

As a further preferred embodiment, it is provided that the oblong openings 12 have a channel-shaped, arcuate, undulating, at least approximately sinusoidal, S-shaped and/or lamellar configuration. As a result, at least the first conductive layer of the CC is divided into a plurality of quasi-parallel regions or strips extending in the main current direction, said regions or strips being separated from each other physically by the openings perpendicular to the main current direction. With reference to FIGS. 8 to 10, these openings can be configured in such a manner that they are disposed for example between the solar cells, these openings here being able to extend essentially parallel to each other and being able to have a curved configuration. As an alternative hereto, also arcuate embodiments, corresponding to the mode of representation of FIG. 10, are conceivable. As a common feature, these structures have however a loose arrangement of a plurality of conductive strips via which an efficient reduction in mechanical stress can be effected. It is hereby important that these loose elements have no connection to each other. Furthermore, it is thereby favourable if the cross-section of the CC according to FIG. 8 has, in the region of the contact 7, a smaller cross-section B than the maximum cross-section A.

It is in particular advantageous hereby if the at least one region has at least two, preferably 2 to 50, further preferred 3 to 25, particularly preferred 4 to 15, oblong stamped-out openings for texturing.

For the optional further layers, this advantageous embodiment can of course likewise apply. There should be understood thereby that structures which are textured for mechanical stress reduction (for example channels, recesses or openings which can have a channel-shaped, linear and/or lamellar configuration) are introduced into the respective layer in the region between two current sources. Hence the mechanical flexibility of the transit layer between two current sources is significantly increased. The width of the opening is preferably between 10 μm and 1000 μm, preferably between 50 μm and 300 μm.

Furthermore, it can be advantageous if at least the first conductive layer 3 outwith the at least one contact region 7 comprises at least two regions 11 and 11' which have at least one oblong stamped-out opening 12 for texturing, the course of which is not linear in the main current direction 6, the regions 11 and 11' being connected via a region 13 which is configured without an opening. An embodiment of this type is represented in FIG. 10.

The region 13 hereby has a larger cross-section in the main current direction 6 than corresponds to the sum of the cross-sections of region 11 and also of the contact regions 7. It is ensured by the region 13 that as large as possible currents can flow between the two current sources.

Furthermore, it is advantageous in particular in the case of elongated CC portions (e.g. from 5 mm) if the contact region is configured such that the ratio of contact surface area to the total surface area of the conductive first layer is less than 0.2, preferably less than 0.1. There is understood thereby by the contact surface area the surface area which the contact region has in cross-section. With reference to the Figures, this is the surface area which constitutes the projection of the contact region 7 on the layer 3. This definition also applies to the intermediate contacts 5. There is understood by the total surface area of the first layer the entire surface area of one side of the layer 3 on which the respective contact 5 or 7 is applied.

In an alternative embodiment, it is however likewise possible that the contact region is configured such that the ratio of contact surface area to total surface area of the conductive first layer is between 0.1 and 0.85, preferably between 0.3 and 0.7, particularly preferred between 0.4 and 0.6.

It is thereby favourable if at least 2, preferably 3 to 10, contact regions per current source are present. These contact regions are then configured in particular such that their respective contact surface area with respect to the total surface area of the conductive first layer, in particular with elongated CC portions, is small. Due to the presence of a plurality of contacts, a synergetic effect comprising mechanical stability and flexibility is produced, which enables a significant reduction in stress. Furthermore, it is thereby preferred if the contact regions are at a regular spacing relative to each other. There should be understood thereby regular one- and two-dimensional patterns and/or arrangements, for example in linear, square, hexagonal and/or lozenge-shaped arrangement. An alternative embodiment provides that the cell connector is configured such that only one contact region per current source is present. This contact region then preferably has a larger contact surface area with respect to the total surface area of the first conductive layer.

However it is likewise possible that the current sources have take-off points merely at the edge. In this case, the CC bridges above all the intermediate space of adjacent current sources, this intermediate space 11 being made flexible by lamellar structuring (FIG. 8). As a result, the same advantages are produced as in the previously mentioned embodiments.

Furthermore, it is preferred if the at least one contact region which is present per current source is disposed in the edge region of the cell connector. There is understood thereby that the contact regions are disposed essentially on the outermost points of the CC.

Alternatively, it is however equally possible that the at least one contact region which is present per current source is disposed transversely relative to the current direction essentially in the centre in the cell connector.

It is likewise possible that an insulating layer is disposed between the first layer and the current sources and/or between the first and second layer and/or between the respectively further layers, the insulating layer being perforated respectively by the contact regions.

With respect to the dimensions thereof, the cell connector is configured such that it has a strip-like structure, i.e. has a thickness in the range of several µm to several 100 µm and a width in the range of several mm. The dimensions are thereby not restricted to a particular dimension but preferably the layer thickness of the at least one first and/or each further layer, independently of each other, is between 10 µm and 300 µm, preferably between 20 µm and 100 µm.

The width of the at least one first and/or each further layer, independently of each other, is between 0.5 mm and 50 mm, preferably between 1 mm and 10 mm.

With respect to the materials from which the cell connector is formed, the means is not subject according to the invention to any restriction, merely that the material must be selected from conductive materials with low resistance. Preferably, the components of the cell connector are however selected from the group comprising copper, aluminium and/or silver.

The planar current source is thereby preferably a solar cell and/or fuel cell.

It is thereby irrelevant how the cell connector is used for connection of the planar current sources. For example, the means can be applied as front-, rear-side- and/or side contact on the current source. The current sources can be wired to each other by the means in parallel and/or in series. The means can thereby also connect a front- to a rear-side contact, for example of a solar cell, so that it has a step-like structure.

The present invention is explained in more detail with reference to the accompanying Figures without wishing to restrict the invention to the special embodiments represented there.

BRIEF DESCRIPTION OF THE DRAWINGS

There are thereby shown

DETAILED DESCRIPTION OF THE INVENTION

FIG. 1 shows a cell connector as is known from the state of the art. The cell connector is thereby configured as a continuous copper strip and, in the region of the contact to the current source, is connected continuously to the latter. Hence there is no possibility of reducing mechanical stresses which occur.

In FIG. 2, a CC 1 which has a textured single-layer structure is represented. The textured regions 9 thereby represent openings which here have a quasi-rectangular configuration. In the case of rear-side contact cells, the CC 1 is not casting a shadow so that the layer 3 can be configured widely to increase the conductivity. The layer 3 improves the conductance of the collected current and can have an additional insulating layer towards the cell. The current collection and guidance is effected from the solar cell 2 via the contact regions 7 and the layer 3. Only the contact points 7 are connected to the current source 2. This contacting 7 can be effected for example via soldered contacts. Of course another further conductive layer can be applied here also on the first layer 3 (at the top in the image plane) by means of soldered contacts 5. It is hereby essential to the invention that the cross-section of the cell connector 1 which is produced by a section along the line A represented in FIG. 2 is greater than the cross-section which is produced by a section of the cell connector along the lines B1 and B2. Hence the cross-sectional surface area in the contact region is less than the maximum cross-sectional surface area of the cell connector 1. As a result, excellent flexibility is achieved.

Figure 3:
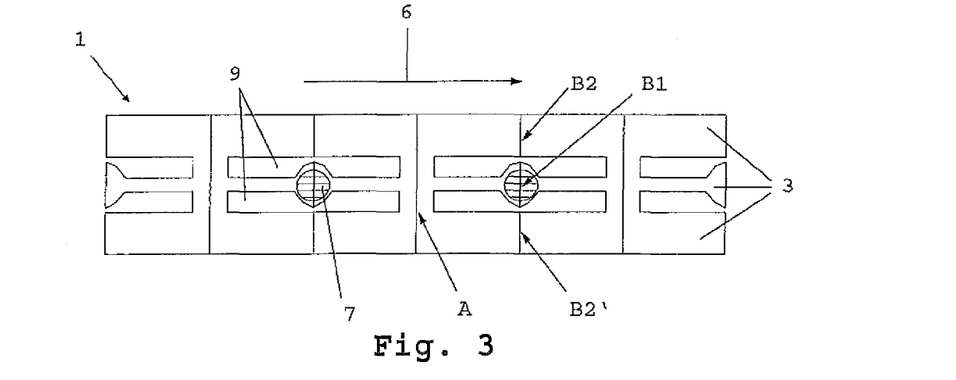

As represented in FIG. 3, the texturing 9 can also be effected such that a single-layer structure results, in which the contact regions 7 can also be disposed between two texturings 9. This leads to improved flexibility of the CC 1. Otherwise the same embodiments as for FIG. 2 apply. The Figures represent plan views on the respective CC 1. As mentioned already in FIG. 2, the cross-section here which is produced along the line B1 and B2 and B2' in FIG. 3, i.e. the cross-sectional surface area of the contact region 7, is also smaller than the maximum cross-section of the cell connector 1. As a result of the fact that the openings are applied respectively in pairs on the contact region 7, a further increase in flexibility of the cell connector 1 is provided.

FIG. 4 shows an embodiment with a varying cross-section of the CC 1. In this plan view, the contact region 7 is hence not directly visible and characterised by the hatched region. As a result of the contacting merely at points, higher mechanical flexibility is produced, whilst the increasing cross-section of the CC 1 towards the region between the current sources 2 and 2' ensures that improved current conduction of the current accumulated over the entirety of the contacts 7 is provided. The cell connector 1 represented in FIG. 4 is now distinguished in that, starting from the edge region, the cross-section thereof increases constantly (this corresponds to the cross-sectional surface areas which are produced by the section of the cell connector along the lines B1, B2, B3 and B4). The CC 1 reaches its maximum cross-sectional region in the bridging region between two solar cells 2 and 2'. This increase in cross-section is effected in that the current flow in the current direction, i.e. between the two cells 2 and 2', accumulates over the four contacts 7 and hence is increased. Due to the increasing cross-section in the current direction, it is now ensured that efficient current conduction is ensured.

A CC 1 with a varying cross-section is however possible also in an embodiment represented in FIG. 5 in which a texturing 9 of the layer 3 is present in addition. The embodiments for FIG. 2 and FIG. 3 apply. Hence this embodiment is a combination of the increasing cross-section of FIG. 6 and of the embodiment of the contact portions according to FIG. 4. In this embodiment, it is also constantly ensured that the cross-sectional surface area in the contact regions 7 (characterised by the sum of the section surface areas along the lines B1 and B2 or B1 and B2') is always smaller than the maximum cross-section, e.g. along the line A.

FIGS. 6a and 6b show a CC 1 which comprises two layers 3, 4. FIG. 6a thereby shows the structure of a CC 1 comprising two layers, whilst FIG. 6b represents the electrical contacting of the CC 1 to a solar cell 2. The arrow 6 marks the current direction. The two layers 3, 4 are connected to each other, e.g. soldered or glued conductively, only in portions 5. The contacting 7 to the solar cell is effected likewise in portions via the layer 3 of the CC 1 which is orientated towards the cell. The connection points 5 and 7 are thereby mutually offset. The contact regions 7 are connected to the CC 1 via a smaller cross-section than corresponds to its maximum, electrically conductive cross-section. The maximum conductive cross-section hereby represents the sum of the layer thicknesses 3 and 4 and also of the contacts 5; the smaller cross-section of the contact region 7 is in contrast defined only by the two layer thicknesses 3 and 4. If such a multilayer CC 1 is provided with a shoulder 8 (FIG. 7), as is required for series wiring of solar cells, a reduced danger of rupture exists upon expansion because a smaller preloading of the loose bond at the bent edges is produced.

FIG. 8 shows an embodiment, by way of example, of a multi-divided, indirect course in lamellar form 12 of the CC 1 which connects two adjacent RSCC with edge contacts. By dividing the connection cross-section into lamellar structures, which were produced by S-shaped incisions in the part 11 of the CC 1 which bridges the two solar cells 2 and 2', the flexural rigidity of such arcuate connection pieces drops significantly, a transition from rigid to loose bond is achieved. In a CC 1 with a material thickness of for example 100 µm, gap widths below 100 µm can be produced. Such a course can also be provided in any differently configured CC 1 for reducing the mechanical stress, for example in rectangular form as represented in FIG. 9. Also in the embodiment represented in FIG. 8, the CC 1 is distinguished in that its cross-section along the line B which extends in the contact region is smaller than its maximum cross-section (characterised by the line A). Of course, also multilayer structures are conceivable here, also the contacting in the case of a plurality of layers requiring here to be effected merely at points.

In FIG. 10, a cell connector 1 for connecting solar cells (2, 2') is represented, said cell connector having take-off points 7 in the edge region. The layer 3 is thereby contacted in pairs via the contact regions 7 to the solar cells (2, 2') and has textured regions 11 and 11' which have lamellar openings 12 and are attached to a connection piece 13 which carries a plurality of contact pairs. The current flows perpendicular 6 to the connection piece 13. This embodiment is distinguished in that the regions 11 and 11', which contact the connection piece 13 on both sides, are textured or structured by a plurality of arcuate openings, as a result of which a loose bond of a plurality of conductor strands is produced. It is thereby characterising that these conductor strands are not connected to each other so that these conductor strands have extremely high flexibility relative to each other. Such an arrangement enables an exceptionally efficient reduction or lowering of mechanical stresses.

The invention claimed is:

1. A cell connector in a planar form for electrical contacting of at least two planar current sources, which cell connector comprises at least one first electrically conductive layer which has at least one contact region for making contact in regions with each of the current sources, wherein
    at least the first conductive layer outside the at least one contact region comprises at least one region, the course of which is not linear in the main current direction and which is subdivided by at least one oblong stamped-out division or opening into at least two strips which extend essentially parallel to the main current direction.

2. A cell connector according to claim 1, wherein the maximum cross-section of the cell connector is dimensioned such that the total current flowing between the current sources can flow with a maximum electrical load.

3. A cell connector according to claim 1, wherein the cross-section of the at least one region is dimensioned such that the total current flowing between the current sources can flow with a maximum electrical load.

4. A cell connector according to claim 1, wherein at least the first layer has at least one opening for texturing, which abuts against the at least one contact region.

5. A cell connector according to claim 4, wherein the at least one opening has an essentially square, rectangular, lozenge-shaped, oval and/or circular configuration.

6. A cell connector according to claim 1, wherein the number of openings corresponds to the number of contact regions.

7. A cell connector according to claim 2, wherein at least two openings abut against each contact region.

8. A cell connector according to claim 7, wherein two openings abut against each contact region, said openings being disposed respectively on the oppositely-situated side of the contact region.

9. A cell connector according to claim 1, wherein the cell connector has an increasing and/or reducing cross-section in the current direction.

10. A cell connector according to claim 1, wherein a second layer which conducts current is disposed on the side of the first layer which is orientated away from the current source, said second layer being in contact in regions with first layer via at least one contact.

11. A cell connector (1) according to claim 10, wherein at least one further layer which conducts current is disposed on the second layer, said further layer being in contact in regions with the layer situated respectively thereunder via at least one contact.

12. A cell connector according to claim 1, wherein the opening has a channel-shaped, arcuate, undulating, at least approximately sinusoidal, S-shaped and/or lamellar configuration.

13. A cell connector according to claim 1, wherein the at least one region has at least two, oblong stamped-out openings for texturing.

14. A cell connector according to claim 12, wherein the width of the at least one opening is between about 10 μm and 1000 μm.

15. A cell connector according to claim 1, wherein at least the first conductive layer outside the at least one contact region comprises at least two regions which have at least one oblong stamped-out opening for texturing, the course of which is not linear in the main current direction, the at least two regions being connected via a region which is configured without an opening.

16. A cell connector according to claim 1, wherein at least 2, contact regions per current source are present.

17. A cell connector according to claim 16, wherein the at least 2 contact regions are disposed at a regular spacing relative to each other.

18. A cell connector according to claim 1, wherein only one contact region per current source is present.

19. A cell connector according to claim 1, wherein the at least one contact region which is present per current source is disposed essentially in the edge region of the cell connector.

20. A cell connector according to claim 1, wherein the at least one contact region which is present per current source is disposed transversely relative to the current direction essentially in the centre in the cell connector.

21. A cell connector according to claim 1, wherein the contact regions are configured such that the ratio of contact surface area to total surface area of the conductive first layer is less than 0.2.

22. A cell connector according to claim 1, wherein the contact regions are configured such that the ratio of contact surface area to total surface area of the conductive first layer is between 0.1 and 0.85.

23. A cell connector according to claim 1, wherein an insulating layer is disposed between the first layer and the current sources and/or between the first and second layer and/or between the respectively further layers, the insulating layer being perforated respectively by the contact regions.

24. A cell connector according to claim 1, wherein the layer thickness of the at least one first and/or each further layer, independently of each other, is between 10 μm and 300 μm.

25. A cell connector according to claim 1, wherein the width of the at least one first and/or each further layer, independently of each other, is between 0.5 mm and 50 mm.

26. A cell connector according to claim 1, wherein at least the first layer comprises materials selected from the group comprising copper, aluminium and/or silver.

27. A cell connector according to claim 1, wherein the cell connector can be applied on the current source as a front-, rear-side- and/or side contact.

28. A cell connector according to claim 1, wherein at least two current sources can be wired to each other in parallel and/or in series.

29. A cell connector according to claim 1, wherein the at least one contact region is formed by soldering to the current sources.

30. A method of electrically connecting at least two planar current sources, comprising installing a cell connector wherein the cell connector comprises at least one first electrically conductive layer which has at least one contact region for making contact in regions with each of the current sources wherein
at least the first conductive layer outside the at least one contact region comprises at least one region, the course of which is not linear in the main current direction and which is subdivided by at least one oblong stamped-out division or opening into at least two strips which extend essentially parallel to the main current direction.

31. The method according to claim 30, wherein the at least two current sources are solar cells and/or fuel cells.

32. The method according to claim 31, wherein the cell connector is applied on the current sources as a front-, rear-side- and/or side contact.

33. A cell connector according to claim 1, wherein a cross-section of the cell connector in the at least one contact region is smaller in the main current direction than a maximum cross-section of the cell connector in the main current direction.

34. The method according to claim 30, wherein the cross-section of the cell connector in the at least one contact region is smaller in the main current direction than the maximum cross-section of the cell connector in the main current direction.

* * * * *